(12) United States Patent
Ohta et al.

(10) Patent No.: US 8,786,278 B2
(45) Date of Patent: Jul. 22, 2014

(54) THREE-DIMENSIONAL MAGNETIC FIELD SENSOR AND METHOD OF PRODUCING SAME

(75) Inventors: Naoki Ohta, Tokyo (JP); Hiroshi Yamazaki, Tokyo (JP)

(73) Assignee: TDK Corporation, Tokyo (JP)

( * ) Notice: Subject to any disclaimer, the term of this patent is extended or adjusted under 35 U.S.C. 154(b) by 249 days.

(21) Appl. No.: 13/493,495

(22) Filed: Jun. 11, 2012

(65) Prior Publication Data

US 2013/0134969 A1    May 30, 2013

(30) Foreign Application Priority Data

Nov. 24, 2011    (JP) .................................. 2011-255969

(51) Int. Cl.
*G01R 33/02* (2006.01)
*G01R 33/09* (2006.01)

(52) U.S. Cl.
USPC .......................................... 324/247; 324/252

(58) Field of Classification Search
CPC ................................. G01R 33/09; G01R 33/02
USPC .................... 324/244–253, 260–262
See application file for complete search history.

(56) References Cited

U.S. PATENT DOCUMENTS

| | | | |
|---|---|---|---|
| 6,545,462 B2 | 4/2003 | Schott et al. | |
| 6,791,320 B2 * | 9/2004 | Hasegawa et al. | 324/252 |
| 7,589,939 B2 * | 9/2009 | Wakui et al. | 360/324.1 |
| 2004/0080872 A1 | 4/2004 | Sato et al. | |
| 2009/0027048 A1 * | 1/2009 | Sato et al. | 324/247 |

FOREIGN PATENT DOCUMENTS

| | | |
|---|---|---|
| JP | A-2002-71381 | 3/2002 |
| JP | A-2004-193540 | 7/2004 |
| JP | A-2006-275764 | 10/2006 |
| JP | A-2007-256293 | 10/2007 |
| JP | A-2009-002838 | 1/2009 |
| JP | B2-4293922 | 4/2009 |
| JP | A-2009-300150 | 12/2009 |

OTHER PUBLICATIONS

Ikeda et al., "A perpendicular-anisotropy CoFeB-MgO magnetic tunnel junction," Nature Materials, vol. 9, pp. 721-724, 2010.
Yakushiji et al., "High magnetoresistance ratio and low resistance-area product in magnetic tunnel junctions with perpendicularly magnetized electrodes," Applied Physics Express 3, pp. 1-3, 2010.
Japanese Office Action issued in Japanese Application No. 2011-255969 mailed Oct. 22, 2013 (with translation).

* cited by examiner

*Primary Examiner* — Arleen M Vazquez
*Assistant Examiner* — Alesa Allgood
(74) *Attorney, Agent, or Firm* — Oliff PLC

(57) ABSTRACT

A three-dimensional magnetic field sensor includes a substrate having an element placement surface that is planar, and first, second and third MR elements disposed on a side of the element placement surface of the substrate and integrated with the substrate. Each of the first, second and third MR elements includes a magnetization pinned layer, a nonmagnetic layer, and a free layer. The magnetization pinned layer of the first MR element has a magnetization direction that is pinned in an X direction parallel to the element placement surface. The magnetization pinned layer of the second MR element has a magnetization direction that is pinned in a Y direction parallel to the element placement surface and different from the X direction. The magnetization pinned layer of the third MR element has a magnetization direction that is pinned in a Z direction perpendicular to the element placement surface.

7 Claims, 7 Drawing Sheets

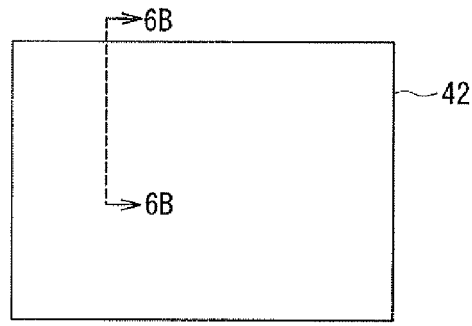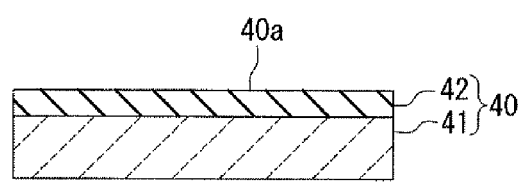
FIG. 6A  FIG. 6B
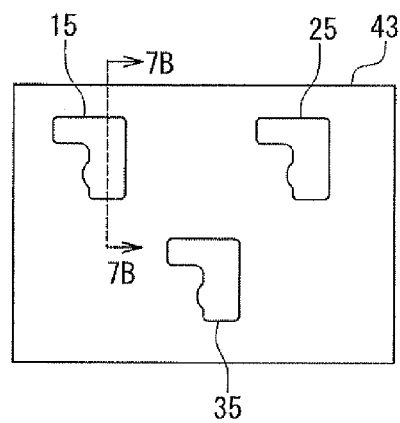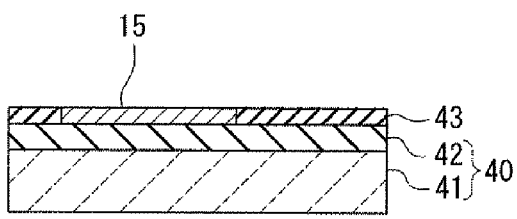
FIG. 7A  FIG. 7B

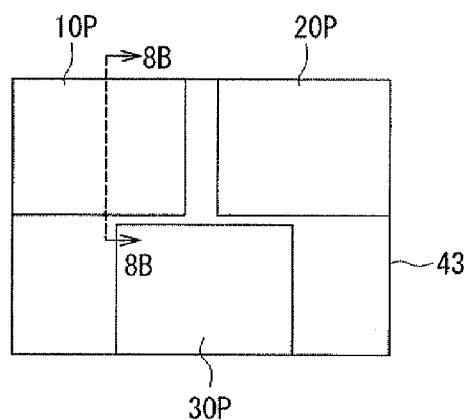
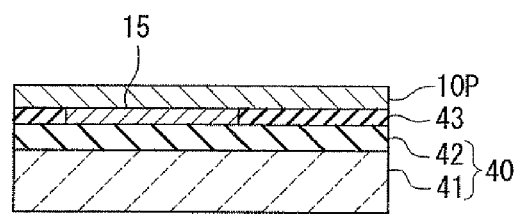
FIG. 8A  FIG. 8B
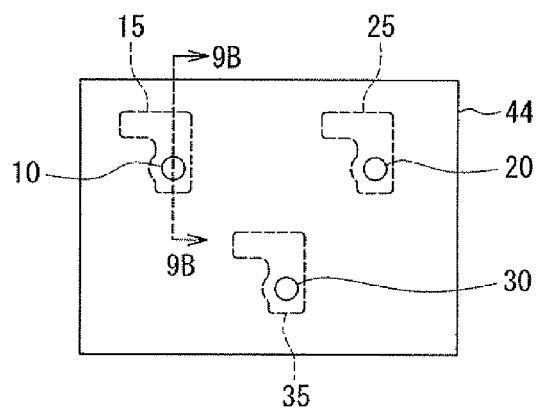
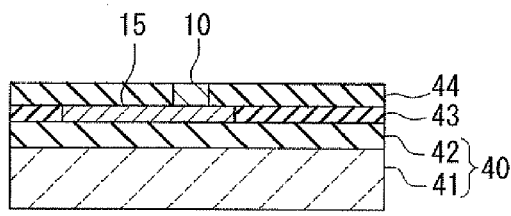
FIG. 9A  FIG. 9B

THREE-DIMENSIONAL MAGNETIC FIELD SENSOR AND METHOD OF PRODUCING SAME

BACKGROUND OF THE INVENTION

1. Field of the Invention

The present invention relates to a three-dimensional magnetic field sensor for detecting the three-dimensional direction of an external magnetic field, and to a method of producing the same.

2. Description of the Related Art

In recent years, three-dimensional magnetic field sensors for detecting the three-dimensional direction of an external magnetic field are used for the purpose of, for example, detecting the three-dimensional direction of terrestrial magnetism. Generally, a three-dimensional magnetic field sensor includes three detection elements for detecting the strengths of three mutually orthogonal components of an external magnetic field. A conventional three-dimensional magnetic field sensor has required that, for example, the arrangement of its three detection elements be specially designed because the sensitive directions of the three detection elements must be set to be orthogonal to each other. To configure three-dimensional magnetic field sensors, the following various technologies have been proposed.

In the technology disclosed in Japanese Patent No. 4293922, two magnetic sensor modules are side-mounted on a substrate, and one Hall element is bare-mounted on the substrate. One of the side-mounted magnetic sensor modules includes an internal Hall element that detects a terrestrial magnetism component in an X-axis direction parallel to the surface of the substrate, and the other side-mounted magnetic sensor module includes an internal Hall element that detects a terrestrial magnetism component in a Y-axis direction parallel to the surface of the substrate and orthogonal to the X-axis direction. The bare-mounted Hall element detects a terrestrial magnetism component in a Z-axis direction perpendicular to the surface of the substrate.

In the technology disclosed in JP-A-2007-256293, a V-shaped groove is formed in a substrate, and two magnetoresistive elements, one for detecting a magnetic field in an X-axis direction and the other for detecting a magnetic field in a Y-axis direction, are disposed on the surface of the substrate. In addition, another magnetoresistive element for detecting a magnetic field in a Z-axis direction is mounted on an inclined surface of the V-shaped groove.

In the technology disclosed in U.S. Pat. No. 6,545,462 B2, a magnetic field concentrator that alters the course of the lines of magnetic force is stacked on a semiconductor chip including a plurality of Hall elements, so that components of an external magnetic field in three directions can be detected.

In the technology disclosed in JP-A-2006-275764, a Hall element having a magnetic field sensitive axis in a Z-axis direction, a magnetoresistive element having a magnetic field sensitive axis in an X-axis direction, and a magnetoresistive element having a magnetic field sensitive axis in a Y-axis direction are disposed on a single substrate.

Three-dimensional magnetic field sensors can be configured with the technologies disclosed in Japanese Patent No. 4293922, JP-A-2007-256293, U.S. Pat. No. 6,545,462 B2, and JP-A-2006-275764 cited above. However, these technologies have the following problems.

The problem with the technology disclosed in Japanese Patent No. 4293922 is that, since the side-mounting of the two magnetic sensor modules on the substrate requires much time and effort, the production cost of the three-dimensional magnetic field sensor is high.

The problem with the technology disclosed in JP-A-2007-256293 is that, since the formation of the V-shaped groove in the substrate and the placement of the magnetoresistive element on the inclined surface of the V-shaped groove require much time and effort, the production cost of the three-dimensional magnetic field sensor is high.

The problem with the technology disclosed in U.S. Pat. No. 6,545,462 B2 is that, since there is a need for the step of stacking the magnetic field concentrator on the semiconductor chip including the plurality of Hall elements, the production cost of the three-dimensional magnetic field sensor is high.

The problem with the technology disclosed in JP-A-2006-275764 is that, since the step of forming the Hall element, which is a semiconductor element, is significantly different from the steps of forming the two magnetoresistive elements, the production cost of the three-dimensional magnetic field sensor is high.

OBJECT AND SUMMARY OF THE INVENTION

It is an object of the present invention to provide a three-dimensional magnetic field sensor that has a simple structure and can be produced at reduced cost, and to provide a method of producing such a three-dimensional magnetic field sensor.

A three-dimensional magnetic field sensor of the present invention is used to detect a three-dimensional direction of an external magnetic field. The three-dimensional magnetic field sensor includes: a substrate having an element placement surface that is planar; and first, second and third magnetoresistive elements disposed on a side of the element placement surface of the substrate and integrated with the substrate. Each of the first, second and third magnetoresistive elements includes a magnetization pinned layer, a nonmagnetic layer, and a free layer that are stacked in a direction perpendicular to the element placement surface. In each of the first, second and third magnetoresistive elements, the nonmagnetic layer is disposed between the magnetization pinned layer and the free layer, and the free layer has a magnetization direction that varies according to the direction of the external magnetic field.

The magnetization pinned layer of the first magnetoresistive element has a magnetization direction that is pinned in a first direction parallel to the element placement surface. The magnetization pinned layer of the second magnetoresistive element has a magnetization direction that is pinned in a second direction parallel to the element placement surface and different from the first direction. The magnetization pinned layer of the third magnetoresistive element has a magnetization direction that is pinned in a third direction perpendicular to the element placement surface. The first magnetoresistive element detects the strength of a component of the external magnetic field in the first direction. The second magnetoresistive element detects the strength of a component of the external magnetic field in the second direction. The third magnetoresistive element detects the strength of a component of the external magnetic field in the third direction.

In the three-dimensional magnetic field sensor of the present invention, the second direction may be orthogonal to the first direction. The three-dimensional magnetic field sensor of the present invention may further include an arithmetic circuit that generates, based on outputs from the first, second and third magnetoresistive elements, data indicative of the three-dimensional direction of the external magnetic field.

In the three-dimensional magnetic field sensor of the present invention, materials of the magnetization pinned layer, the nonmagnetic layer and the free layer of the second magnetoresistive element may be the same as those of the magnetization pinned layer, the nonmagnetic layer and the free layer of the first magnetoresistive element, respectively.

In the three-dimensional magnetic field sensor of the present invention, the magnetization pinned layer of the third magnetoresistive element may contain at least one of an ordered alloy, an artificial lattice composed of a multilayer film, and an amorphous alloy. The free layer of the third magnetoresistive element may have a coercivity in the third direction lower than that of the magnetization pinned layer of the third magnetoresistive element.

A method of producing the three-dimensional magnetic field sensor of the present invention includes the steps of; forming the first magnetoresistive element; forming the second magnetoresistive element; and forming the third magnetoresistive element. The step of forming the first magnetoresistive element includes the steps of forming a first stack, the first stack including a first film, the nonmagnetic layer of the first magnetoresistive element and the free layer of the first magnetoresistive element, the first film being intended to later undergo pinning of its magnetization direction to thereby become the magnetization pinned layer of the first magnetoresistive element; and pinning the magnetization direction of the first film so that the first film becomes the magnetization pinned layer of the first magnetoresistive element. The step of forming the second magnetoresistive element includes the steps of: forming a second stack, the second stack including a second film, the nonmagnetic layer of the second magnetoresistive element and the free layer of the second magnetoresistive element, the second film being intended to later undergo pinning of its magnetization direction to thereby become the magnetization pinned layer of the second magnetoresistive element; and pinning the magnetization direction of the second film so that the second film becomes the magnetization pinned layer of the second magnetoresistive element. The step of forming the first stack and the step of forming the second stack are performed simultaneously. The step of pinning the magnetization direction of the first film and the step of pinning the magnetization direction of the second film are performed separately.

In the three-dimensional magnetic field sensor and the method of producing the same of the present invention, the first to third magnetoresistive elements, each of which includes a magnetization pinned layer, a nonmagnetic layer and a free layer stacked in the direction perpendicular to the element placement surface of the substrate, are disposed on the side of the element placement surface the substrate. The three-dimensional magnetic field sensor of the present invention thus has a relatively simple structure. In addition, the steps of forming the first, second, and third magnetoresistive elements do not differ from each other as greatly as do the steps of forming a Hall element and forming a magnetoresistive element. It is therefore relatively easy to produce the three-dimensional magnetic field sensor of the present invention. The present invention thus makes it possible to provide a three-dimensional magnetic field sensor that has a simple structure and can be produced at reduced cost.

In the method of producing the three-dimensional magnetic field sensor of the present invention, the step of forming the first stack and the step of forming the second stack are performed simultaneously. This allows a further reduction of the production cost of the three-dimensional magnetic field sensor.

Other and further objects, features and advantages of the present invention will appear more fully from the following description.

BRIEF DESCRIPTION OF THE DRAWINGS

FIG. 6A and FIG. 6B are explanatory diagrams showing a step of a method of producing the three-dimensional magnetic field sensor according to the first embodiment of the invention.

FIG. 7A and FIG. 7B are explanatory diagrams showing a step that follows the step shown in FIG. 6A and FIG. 6B.

FIG. 8A and FIG. 8B are explanatory diagrams showing a step that follows the step shown in FIG. 7A and FIG. 7B.

FIG. 9A and FIG. 9B are explanatory diagrams showing a step that follows the step shown in FIG. 8A and FIG. 8B.

DETAILED DESCRIPTION OF THE PREFERRED EMBODIMENTS

First Embodiment

Figure 1:
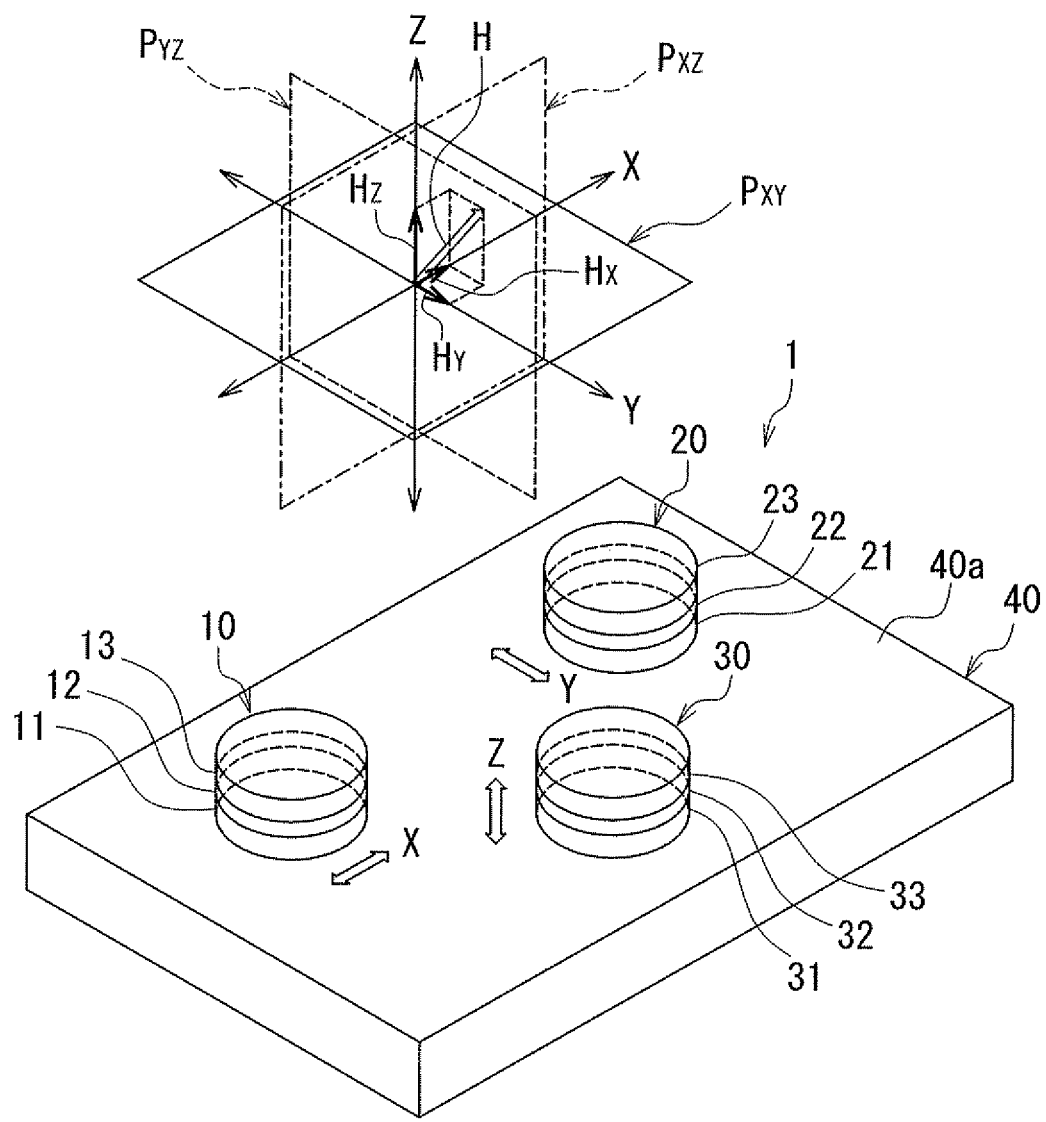
FIG. 1 is a perspective view showing the general configuration of a three-dimensional magnetic field sensor according to a first embodiment of the invention.

Preferred embodiments of the present invention will now be described in detail with reference to the drawings. First, reference is made to FIG. 1 to describe the general configuration of a three-dimensional magnetic field sensor according to a first embodiment of the invention. FIG. 1 is a perspective view showing the general configuration of the three-dimensional magnetic field sensor according to the first embodiment.

As shown in FIG. 1, the three-dimensional magnetic field sensor 1 according to the present embodiment includes a substrate 40, a first magnetoresistive (MR) element 10, a second MR element 20, and a third MR element 30. The substrate 40 has an element placement surface 40a that is planar. The first to third MR elements 10, 20 and 30 are disposed on the side of the element placement surface 40a of the substrate 40 and integrated with the substrate 40. The MR element 10 includes a magnetization pinned layer 11, a nonmagnetic layer 12, and a free layer 13 that are stacked in a direction perpendicular to the element placement surface 40a. The MR element 20 includes a magnetization pinned layer 21, a nonmagnetic layer 22, and a free layer 23 that are stacked in the direction perpendicular to the element placement surface 40a. The MR element 30 includes a magnetization pinned layer 31, a nonmagnetic layer 32, and a free layer 33 that are stacked in the direction perpendicular to the element placement surface 40a.

In the MR elements 10, 20 and 30, the nonmagnetic layers 12, 22 and 32 are disposed between the magnetization pinned layers 11, 21 and 31 and the free layers 13, 23 and 33, respectively. The magnetization directions of the free layers 13, 23 and 33 vary according to the direction of an external magnetic field H.

FIG. 1 shows an example in which the magnetization pinned layers 11, 21 and 31 are disposed closer to the element placement surface 40a than are the free layers 13, 23 and 33. However, at least one of the MR elements 10, and 30 may be configured so that the free layer is disposed closer to the element placement surface 40a than is the magnetization pinned layer.

The magnetization direction of the magnetization pinned layer 11 of the MR element 10 is pinned in a first direction parallel to the element placement surface 40a. The magnetization direction of the magnetization pinned layer 21 of the MR element 20 is pinned in a second direction parallel to the element placement surface 40a and different from the first direction. The magnetization direction of the magnetization pinned layer 31 of the MR element 30 is pinned in a third direction perpendicular to the element placement surface 40a.

Preferably, the second direction is orthogonal to the first direction. In the following description, the second direction is assumed to be orthogonal to the first direction, and the first, second, and third directions are defined as X, Y, and Z directions, respectively. The strengths of components of the external magnetic field H in the X, Y, and Z direction will be represented by symbols $H_X$, $H_Y$, and $H_Z$, respectively. The MR element 10 detects the strength $H_X$, the MR element 20 detects the strength $H_Y$, and the MR element 30 detects the strength $H_Z$. In FIG. 1, the plane denoted by symbol $P_{XY}$ is an XY plane, the plane denoted by symbol $P_{XZ}$ is an XZ plane, and the plane denoted by symbol $P_{YZ}$ is a YZ plane.

The MR elements 10, 20 and 30 are, for example, spin-valve giant magnetoresistive (GMR) elements or tunneling magnetoresistive (TMR) elements. The nonmagnetic layers 12, 22 and 32 are nonmagnetic conductive layers when the MR elements are spin-valve GMR elements, and are tunnel barrier layers when the MR elements are TMR elements. Generally, a tunnel barrier layer is an insulating layer formed of an insulating material such as aluminum oxide or magnesium oxide. The materials of the magnetization pinned layer 21, the nonmagnetic layer 22 and the free layer 23 of the MR element 20 may be the same as the materials of the magnetization pinned layer 11, the nonmagnetic layer 12 and the free layer 13 of the MR element 10, respectively. A current for detecting the magnetic field strength, which will hereinafter be referred to as a sense current, is supplied to each of the MR elements 10, 20 and 30 so as to flow in a direction crossing the plane of the layers constituting the MR elements, such as a direction perpendicular to the plane of the layers constituting the MR elements.

The resistance value of the MR element 10 varies according to the strength $H_X$. The resistance value of the MR element 20 varies according to the strength $H_Y$. The resistance value of the MR element 30 varies according to the strength $H_Z$. Therefore, when a constant sense current is supplied to each of the MR elements 10, 20 and 30, the potential difference across the MR element 10 varies according to the strength $H_X$, the potential difference across the MR element 20 varies according to the strength $H_Y$, and the potential difference across the MR element 30 varies according to the strength $H_Z$.

In this way, the strengths $H_X$, $H_Y$, and $H_Z$ can be detected by the MR elements 10, 20, and 30, respectively. The outputs from the MR elements 10, 20, and 30 may be, for example, the respective potential differences across the MR elements 10, 20, and 30.

Figure 2:
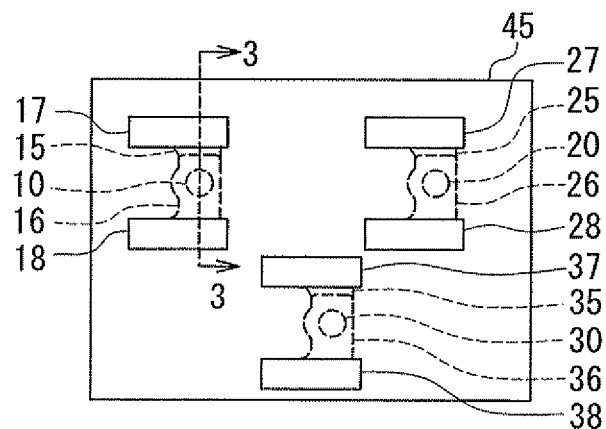
FIG. 2 is a plan view showing the configuration of the three-dimensional magnetic field sensor according to the first embodiment of the invention.
Figure 3:
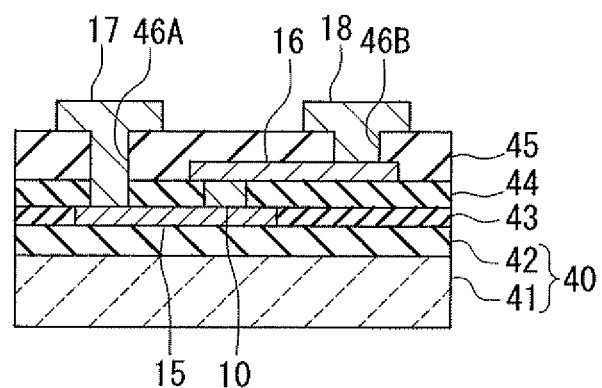
FIG. 3 is a cross-sectional view taken along line 3-3 of FIG. 2.

An example of the specific configuration of the three-dimensional magnetic field sensor 1 will now be described with reference to FIG. 2 and FIG. 3. FIG. 2 is a plan view showing the configuration of the three-dimensional magnetic field sensor 1. FIG. 3 is a cross-sectional view taken along line 3-3 of FIG. 2. FIG. 3 shows the configuration around the MR element 10 in the three-dimensional magnetic field sensor 1. The configurations around the MR elements 20 and 30 are similar to the configuration shown in FIG. 3. In the example shown in FIG. 2 and FIG. 3, the substrate 40 includes a semiconductor substrate 41 formed of a semiconductor such as Si and an insulating layer 42 formed on the top surface of the semiconductor substrate 41. The top surface of the insulating layer 42 serves as the planar element placement surface 40a. The substrate 40 is not limited to one including the semiconductor substrate 41 and the insulating layer 42, and may be composed only of an insulating substrate.

In the example shown in FIG. 2 and FIG. 3, the three-dimensional magnetic field sensor 1 includes lower leads 15, 25 and 35 disposed on the element placement surface 40a of the substrate 40, and an insulating layer 43 disposed on the element placement surface 40a and surrounding the lower leads 15, 25 and 35. The MR element 10 is disposed on the lower lead 15, the MR element 20 is disposed on the lower lead 25, and the MR element 30 is disposed on the lower lead 35. The three-dimensional magnetic field sensor 1 further includes an insulating layer 44 disposed over the lower leads 15, 25 and 35 and the insulating layer 43 and surrounding the MR elements 10, 20 and 30.

The three-dimensional magnetic field sensor 1 further includes an upper lead 16 disposed over the MR element 10 and the insulating layer 44, an upper lead 26 disposed over the MR element 20 and the insulating layer 44, and an upper lead 36 disposed over the MR element 30 and the insulating layer 44. The three-dimensional magnetic field sensor 1 further includes a protective film 45 made of an insulating material and covering the upper leads 16, 26 and 36 and the insulating layer 44.

The three-dimensional magnetic field sensor 1 further includes three contact holes 46A penetrating the protective film 45 and the insulating layer 44 to reach the top surfaces of the lower leads 15, 25 and 35, and three contact holes 46B penetrating the protective film 45 to reach the top surfaces of the upper leads 16, 26 and 36.

The three-dimensional magnetic field sensor 1 further includes: a terminal 17 that passes through the contact hole 46A on the lower lead 15 and is connected to the lower lead 15; a terminal 27 that passes through the contact hole 46A on the lower lead 25 and is connected to the lower lead 25; and a terminal 37 that passes through the contact hole 46A on the lower lead 35 and is connected to the lower lead 35.

The three-dimensional magnetic field sensor 1 further includes: a terminal 18 that passes through the contact hole 46B on the upper lead 16 and is connected to the upper lead 16; a terminal 28 that passes through the contact hole 46B on the upper lead 26 and is connected to the upper lead 26; and a terminal 38 that passes through the contact hole 46B on the upper lead 36 and is connected to the upper lead 36.

Each of the terminals 17, 27, 37, 18, 28, and 38 includes a pad disposed on the protective film 45. The lower leads 15, 25 and 35, the upper leads 16, 26 and 35 and the terminals 17, 27, 37, 18, 28 and 38 are all formed of conductive material.

The MR element 10 is supplied with a sense current through the lower lead 15, the upper lead 16 and the terminals 17 and 18. The MR element 20 is supplied with a sense current through the lower lead 25, the upper lead 26 and the terminals 27 and 28. The MR element 30 is supplied with a sense current through the lower lead 35, the upper lead 36 and the terminals 37 and 38.

The specific configuration of the three-dimensional magnetic field sensor 1 is not limited to the configuration shown in FIG. 2 and FIG. 3. For example, the terminals 17, 27 and 37 connected to the lower leads 15, 25 and 35 may penetrate the substrate 40 and include pads disposed on the bottom surface of the substrate 40.

Figure 4:
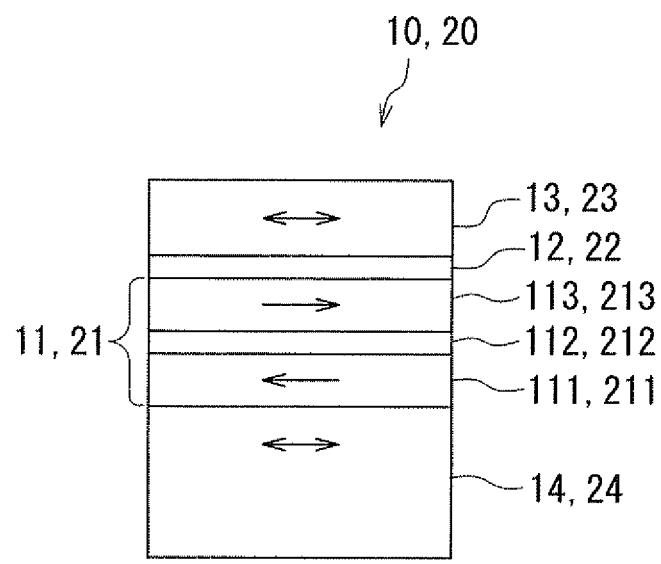
FIG. 4 is a cross-sectional view showing the configuration of first and second magnetoresistive elements of the first embodiment of the invention.

An example of the configuration of the MR elements 10 and 20 will now be described with reference to FIG. 4. FIG. 4 is a cross-sectional view showing the configuration of the MR elements 10 and 20. In the example shown in FIG. 4, the MR element 10 includes not only the magnetization pinned layer 11, the nonmagnetic layer 12 and the free layer 13 but also an antiferromagnetic layer 14 made of an antiferromagnetic material. The magnetization pinned layer 11, the nonmagnetic layer 12 and the free layer 13 are stacked in this order on the antiferromagnetic layer 14. The antiferromagnetic layer 14 pins the magnetization direction of the magnetization pinned layer by means of exchange coupling with the magnetization pinned layer 11.

In this example, the magnetization pinned layer 11 includes an outer layer 111, a nonmagnetic intermediate layer 112, and an inner layer 113 that are stacked in this order on the antiferromagnetic layer 14, and is thus formed as a so-called synthetic pinned layer. The nonmagnetic layer 12 is disposed on the inner layer 113. The outer layer 111 and the inner layer 113 are ferromagnetic layers. The magnetization direction of the outer layer 111 is pinned by the exchange coupling with the antiferromagnetic layer 14. The nonmagnetic intermediate layer 112 is made of, for example, a nonmagnetic material containing at least one selected from the group consisting of Ru, Rh, Ir, Re, Cr, Zr, and Cu. The nonmagnetic intermediate layer 112 induces antiferromagnetic exchange coupling between the outer layer 111 and the inner layer 113, so that the magnetization direction of the outer layer 111 and that of the inner layer 113 are pinned in mutually opposite directions. In the MR element 10, the magnetization direction of the inner layer 113 is pinned in the X direction.

The configuration of the MR element 20 is the same as that of the MR element 10. The MR element 20 includes an antiferromagnetic layer 24 in addition to the magnetization pinned layer 21, the nonmagnetic layer 22 and the free layer 23. The magnetization pinned layer 21, the nonmagnetic layer 22 and the free layer 23 are stacked in this order on the antiferromagnetic layer 24. The magnetization pinned layer 21 includes an outer layer 211, a nonmagnetic intermediate layer 212, and an inner layer 213 that are stacked in this order on the antiferromagnetic layer 24. In the MR element 20, the magnetization direction of the inner layer 213 is pinned in the Y direction.

Each of the MR elements 10 and 20 may have a configuration different from that shown in FIG. 4. For example, the MR elements 10 and 20 may be configured so that the antiferromagnetic layers 14 and 24 are not provided and the magnetization pinned layers 11 and 21 are each formed of a magnetic layer having high coercivity. Each of the magnetization pinned layers 11 and 21 need not necessarily be a synthetic pinned layer and may be composed only of one or more ferromagnetic layers.

Figure 5:
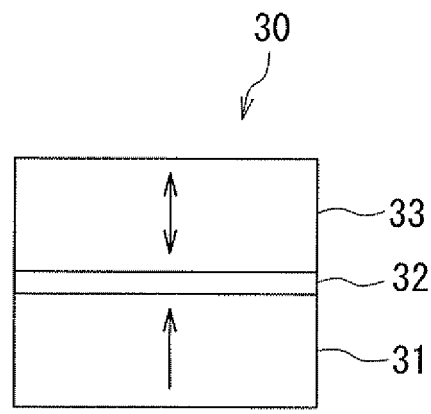
FIG. 5 is a cross-sectional view showing the configuration of a third magnetoresistive element of the first embodiment of the invention.

An example of the configuration of the MR element 30 will now be described with reference to FIG. 5. FIG. 5 is a cross-sectional view showing the configuration of the MR element 30. In the example shown in FIG. 5, the MR element 30 is composed of the magnetization pinned layer 31, the nonmagnetic layer 32 and the free layer 33 stacked in this order from the bottom.

The magnetization direction of the magnetization pinned layer 31 is pinned in the Z direction. The magnetization pinned layer 31 has perpendicular magnetic anisotropy. The magnetization of the free layer 33 changes its direction according to the direction of an external magnetic field H and can contain a component in the Z direction. To the extent that the magnetization of the free layer 33 can contain the component in the Z direction, it may contain components in any directions other than the Z direction.

The magnetization pinned layer 31 can be formed of any material used for a so-called perpendicular magnetization film. More specifically, the magnetization pinned layer 31 may be formed to contain at least one of: an ordered alloy having the $L1_0$ crystal structure such as CoPt and FePt; an artificial lattice composed of a multilayer film such as Co/Pt and Co/Pd; and an amorphous alloy such as CoCr, TbFeCo, and CoFeB.

The free layer 33 can also be formed of any material used for the perpendicular magnetization film mentioned above. However, it is necessary that the free layer 33 can change its magnetization direction easily in response to a change in the direction of the external magnetic field H. Therefore, the free layer 33 must have a coercivity in the Z direction lower than that of the magnetization pinned layer 31. It is also preferable that the free layer 33 should have a perpendicular magnetic anisotropy smaller than that of the magnetization pinned layer 31. The magnetization pinned layer 31 and the free layer 33 that have different properties can be obtained by, for example, appropriately selecting one or more materials for forming each of the layers or controlling the thickness of one or more films included in each of the layers. For example, it is known that the perpendicular magnetic anisotropy of an artificial lattice including a Co layer such as Co/Pt or Co/Pd varies depending on the thickness of the Co layer. Therefore, when an artificial lattice is used, the magnetization pinned layer 31 and the free layer 33 can be obtained by controlling the thicknesses of the Co layer in the artificial lattice.

In S. Ikeda et al., Nature Materials Vol. 9, September 2010, pp. 721-724, there is a description that the perpendicular magnetic anisotropy of a CoFeB layer in contact with a magnesium oxide (MgO) layer varies depending on the thickness of the CoFeB layer. This may be used to obtain the magnetization pinned layer 31 and the free layer 33. More specifically, an MgO layer may be used as the nonmagnetic layer 32, and CoFeB layers with controlled thicknesses may be used as the magnetization pinned layer 31 and the free layer 33.

In Kay Yakushiji et al., Applied Physics Express 3 (2010) 053003, pp. 1-3, there is a description of a TMR element including: a tunnel barrier layer made of magnesium oxide (MgO); a free layer that including a Co/Pt multilayer film and an interface layer composed of CoFeB/CoFe; and a reference layer including a TbFeCo layer and an interface layer composed of CoFeB/CoFe. The MR element 30 may be formed into such a configuration.

A method of producing the three-dimensional magnetic field sensor 1 according to the present embodiment will now be described. The method of producing the three-dimensional magnetic field sensor 1 includes the steps of: forming the MR element 10; forming the MR element 20; and forming the MR element 30. The method of producing the three-dimensional magnetic field sensor 1 according to the present embodiment will be described in detail below with reference to FIG. 6A through FIG. 12B. It is assumed here that the three-dimensional magnetic field sensor 1 has the configuration shown in FIG. 2 and FIG. 3. FIG. 6A to FIG. 12A are plan views each showing a stack of layers formed in process of the producing the three-dimensional magnetic field sensor 1. FIG. 6B to FIG. 12B are cross-sectional views taken along lines nB-nB (n is any integer from 6 to 12 inclusive) in FIG. 6A to FIG. 12A.

In the method of producing the three-dimensional magnetic field sensor 1, as shown in FIG. 6A and FIG. 6B, the substrate 40 including the semiconductor substrate 41 and the insulating layer 42, for example, is prepared first.

FIG. 7A and FIG. 7B show the next step. In this step, first, the lower leads 15, 25 and 35 are formed on the element placement surface 40a of the substrate 40. Next, the insulating layer 43 is formed around the lower leads 15, 25 and 35 on the element placement surface 40a.

FIG. 8A and FIG. 8B show the next step. In this step, an MR stack 10P is formed over the lower lead 15 and the insulating layer 43, an MR stack 20P is formed over the lower lead 25 and the insulating layer 43, and an MR stack 30P is formed over the lower lead 35 and the insulating layer 43. The MR stacks 10P, 20P, and 30P are multilayer films that are to be patterned later into the MR elements 10, 20, and 30, respectively. Therefore, the MR stacks 10P, 20P, and 30P include their respective multiple films that are to be patterned later into the plurality of layers constituting the MR elements 10, 20, and 30. The MR stacks 10P, 20P, and 30P are formed to be separated from each other.

In the present embodiment, the MR elements 10 and 20 can be formed into the same configuration except that the magnetization directions of the magnetization pinned layers 11 and 21 are different from each other. The magnetization directions of the magnetization pinned layers 11 and 21 may be pinned in the step shown in FIG. 8A and FIG. 8B or after the MR stacks 10P, 20P, and 30P are patterned.

In the case of pinning the magnetization directions of the magnetization pinned layers 11 and 21 in the step shown in FIG. 8A and FIG. 8B, the MR stacks 10P and 20P are formed in separate steps, for example. When forming the MR stacks 10P and 20P, the magnetization directions of the films to become the magnetization pinned layers 11 and 21 are pinned by forming each of those films in a magnetic field or by subjecting each of those films to heat treatment in a magnetic field. In this case, of the films to become the magnetization pinned layers 11 and 21, the film of which magnetization direction is first pinned shall have a coercivity higher than that of the other film of which magnetization direction is pinned later. In this manner, the magnetization directions of the films to become the magnetization pinned layers 11 and 21 can be pinned in mutually different directions.

In the case of pinning the magnetization directions of the magnetization pinned layers 11 and 21 after the MR stacks 10P, 20P and 30P are patterned, the MR stacks 10P and 20P may be formed simultaneously. How to pin the magnetization directions of the magnetization pinned layers 11 and 21 in this case will be described later.

The MR stack 30P has a configuration different from the configuration of the MR stacks 10P and 20P, and is therefore formed in a step different from the step(s) of forming the MR stacks 10P and 20P. When forming the MR stack 30P, the magnetization direction of the film to become the magnetization pinned layer 31 is pinned. The pinned magnetization direction is upward or downward perpendicular to the element placement surface 40a. To pin the magnetization direction, heat treatment in a magnetic field can be employed, for example.

FIG. 9A and FIG. 9B show the next step. In this step, first, the MR stacks 10P, 20P, and 30P are etched and thereby patterned into the MR elements 10, 20, and 30, respectively. Next, the insulating layer 44 is formed around the MR elements 10, 20, and 30 on the lower leads 15, 25 and 35 and the insulating layer 43.

A description will now be given of an example of the method of pinning the magnetization directions of the magnetization pinned layers 11 and 21 after the MR stacks 10P, 20P, and 30P are patterned. In this method, first, a laser beam is applied locally to the MR stack 10P while a magnetic field in the X direction is applied to the stack of layers including the patterned MR stacks 10P, 20P, and 30P. The temperature of the film to become the magnetization pinned layer 11 in the MR stack 10P is thereby increased, and is then decreased to pin the magnetization direction of this film in the X direction. This film is thereby made into the magnetization pinned layer 11. Then, a laser beam is similarly applied locally to the MR stack 20P while a magnetic field in the Y direction is applied to the stack of layers including the patterned MR stacks 10P, 20P, and 30P. The temperature of the film to become the magnetization pinned layer 21 in the MR stack 20P is thereby increased, and is then decreased to pin the magnetization direction of this film in the Y direction. This film is thereby made into the magnetization pinned layer 21. Note that the pinning of the magnetization direction of the film to become the magnetization pinned layer 11 in the X direction may be performed after the pinning of the magnetization direction of the film to become the magnetization pinned layer 21 in the Y direction.

In the case of pinning the magnetization directions of the magnetization pinned layers 11 and 21 separately as described above, the MR stacks 10P and 20P may be formed simultaneously. In the method of producing the three-dimensional magnetic field sensor 1 in this case, the step of forming the MR element 10 includes the steps of forming the MR stack 10P including a first film, the nonmagnetic layer 12 and the free layer 13, the first film being intended to later undergo pinning of its magnetization direction to thereby become the magnetization pinned layer 11; and pinning the magnetization direction of the first film so that the first film becomes the magnetization pinned layer 11. The step of forming the MR element 20 includes the steps of; forming the MR stack 20P including a second film, the nonmagnetic layer 22 and the free layer 23, the second film being intended to later undergo pinning of its magnetization direction to thereby become the magnetization pinned layer 21; and pinning the magnetization direction of the second film so that the second film becomes the magnetization pinned layer 21. The MR stack 10P corresponds to the first stack according to the invention. The MR stack 20P corresponds to the second stack according to the invention. The step of forming the MR stack 10P and the step of forming the MR stack 20P are performed simultaneously. However, the step of pinning the magnetization direction of the first film and the step of pinning the magnetization direction of the second film are performed separately.

Figure 10A:
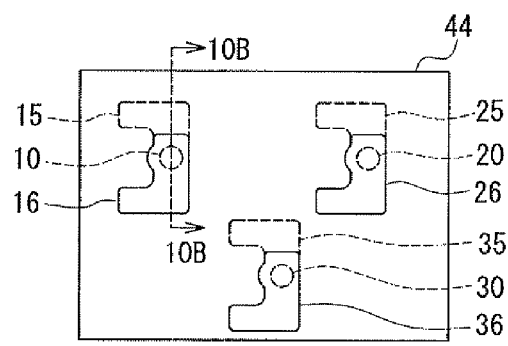
FIG. 10A and FIG. 10B are explanatory diagrams showing a step that follows the step shown in FIG. 9A and FIG. 9B.
Figure 10B:
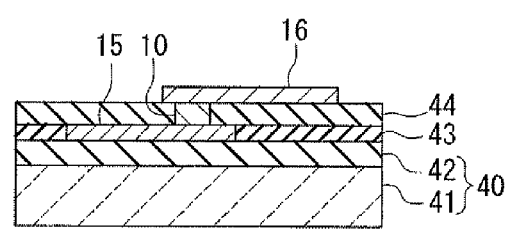

FIG. 10A and FIG. 10B show the next step. In this step, the upper lead 16 is formed over the MR element 10 and the insulating layer 44, the upper lead 26 is formed over the MR element 20 and the insulating layer 44, and the upper lead 36 is formed over the MR element 30 and the insulating layer 44.

Figure 11A:
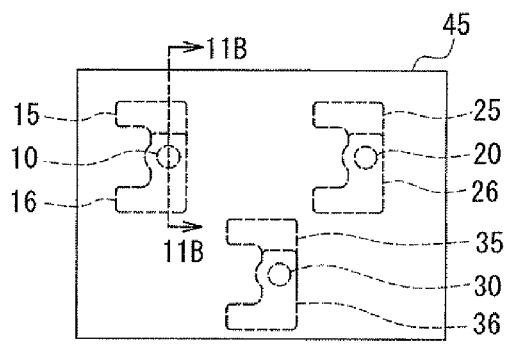
FIG. 11A and FIG. 11B are explanatory diagrams showing a step that follows the step shown in FIG. 10A and FIG. 10B.
Figure 11B:
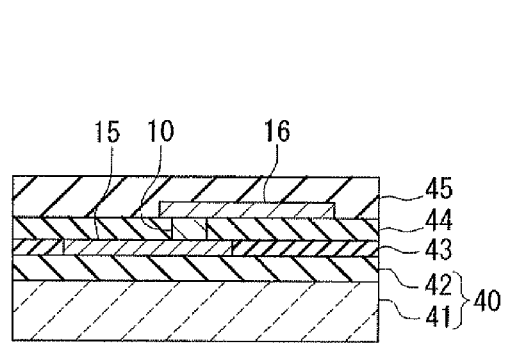

FIG. 11A and FIG. 11B show the next step. In this step, the protective film 45 is formed to cover the upper leads 16, 26 and 36 and the insulating layer 44.

Figures 12A, 12B:
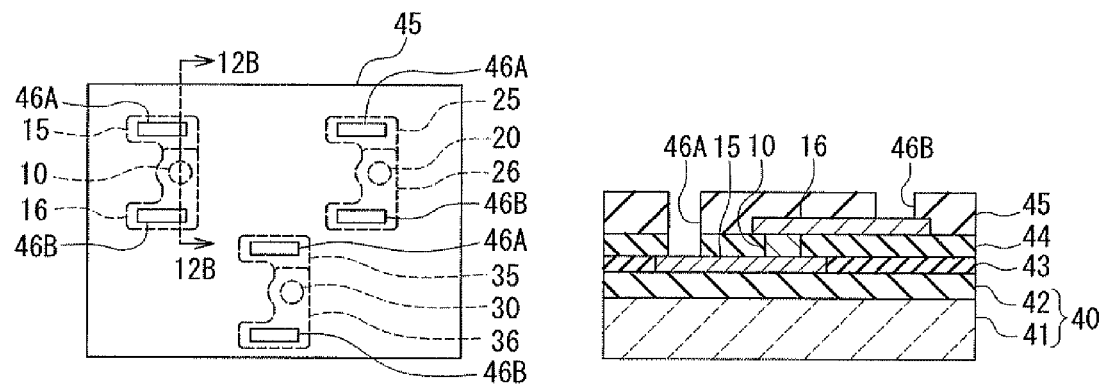
FIG. 12A and FIG. 12B are explanatory diagrams showing a step that follows the step shown in FIG. 11A and FIG. 11B.

FIG. 12A and FIG. 12B show the next step. In this step, wet etching, for example, is performed on the stack of layers shown in FIG. 11A and FIG. 11B to form the three contact holes 46A penetrating the protective film 45 and the insulating layer 44 to reach the top surfaces of the lower leads 15, 25 and 35, and the three contact holes 46B penetrating the protective film 45 to reach the top surfaces of the upper leads 16, 26 and 36.

Next, as shown in FIG. 2 and FIG. 3, the terminals 17, 27, 37, 18, 28, and 38 are formed by plating, for example. The three-dimensional magnetic field sensor 1 is thereby completed.

A description will now be given of the effects of the three-dimensional magnetic field sensor 1 and its production method according to the present embodiment. In the three-dimensional magnetic field sensor 1 according to the present embodiment, the strengths $H_X$, $H_Y$, and $H_Z$ of the components of the external magnetic field H in the X, Y, and Z directions can be detected by the MR elements 10, 20, and 30 having the magnetization pinned layers 11, 21, and 31 whose magnetization directions are pinned in the X, Y, and Z directions, respectively. According to the present embodiment, it is thus possible to detect the three-dimensional direction of the external magnetic field H.

The magnetization directions of the magnetization pinned layers 11 and 21 need not necessarily be orthogonal to each other. Their magnetization directions may be parallel to the element placement surface 40a and form an angle other than 90°. In this case also, the three-dimensional direction of the external magnetic field H can be detected by the MR elements 10, 20, and 30.

In the three-dimensional magnetic field sensor 1 according to the present embodiment, the first, second, and third MR elements 10, 20, and 30 are disposed on the side of the element placement surface 40a of the substrate 40. Each of the MR elements 10, 20, and 30 includes a magnetization pinned layer, a nonmagnetic layer, and a free layer that are stacked in the direction perpendicular to the element placement surface 40a. The structure of the three-dimensional magnetic field sensor 1 is thus relatively simple. The structure of the three-dimensional magnetic field sensor 1 is simpler than the structure of any of the magnetic sensors disclosed in, for example, Japanese Patent No. 4293922, JP-A-2007-256293, U.S. Pat. No. 6,545,462 B2, and JP-A-2006-275764. In addition, the steps of forming the first, second, and third MR elements 10, 20, and 30 do not differ from each other as greatly as do the steps of forming a Hall element and an MR element. It is therefore relatively easy to produce the three-dimensional magnetic field sensor 1. The present embodiment thus makes it possible to provide the three-dimensional magnetic field sensor 1 that has a simple structure and can be produced at reduced cost.

In the method of producing the three-dimensional magnetic field sensor 1 according to the present embodiment, the step of forming the MR stack 10P and the step of forming the MR stack 20P can be performed simultaneously. This allows a further reduction of the production cost of the three-dimensional magnetic field sensor 1.

Second Embodiment

Figure 13:
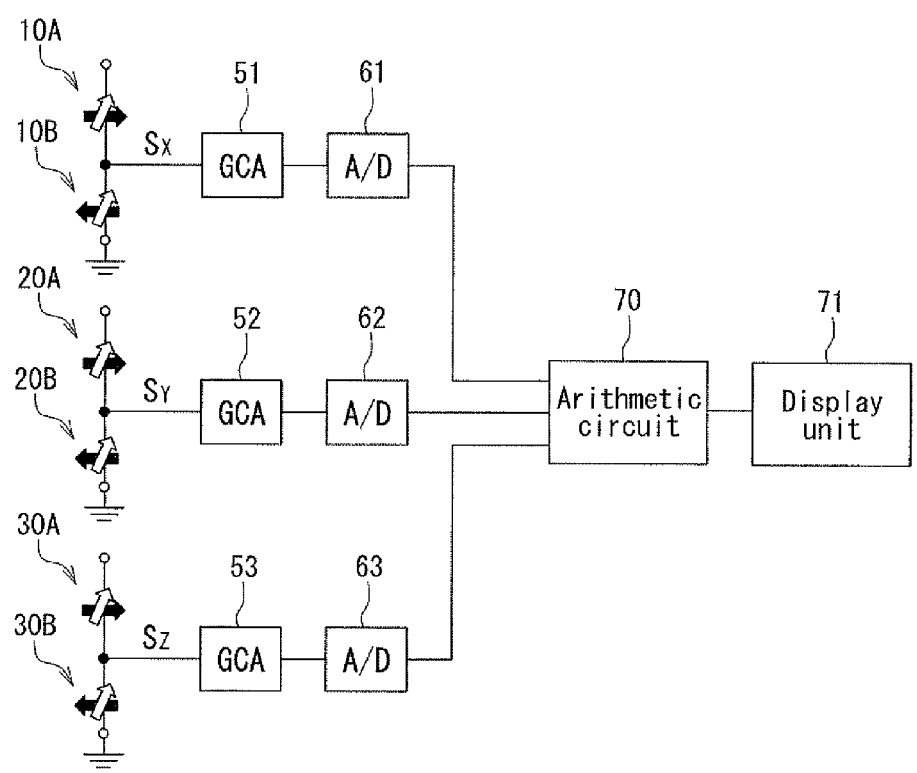
FIG. 13 is a circuit diagram showing the circuit configuration of a three-dimensional magnetic field sensor according to a second embodiment of the invention.

A three-dimensional magnetic field sensor according to a second embodiment of the invention will now be described with reference to FIG. 13. FIG. 13 is a circuit diagram showing the circuit configuration of the three-dimensional magnetic field sensor according to the second embodiment.

The three-dimensional magnetic field sensor according to the second embodiment includes two sets of the first, second, and third MR elements 10, 20, and 30 of the first embodiment. Hereinafter, the MR elements 10, 20, and 30 in a first set will be denoted as MR elements 10A, 20A, and 30A, respectively, and the MR elements 10, 20, and 30 in a second set will be denoted as MR elements 10B, 20B, and 30B, respectively.

The MR elements 10A, 20A and 30A and the MR elements 10B, 20B and 30B may be disposed on the side of the element placement surface 40a of a single substrate 40 and integrated with the substrate 40. Alternatively, the MR elements 10A, 20A and 30A may be disposed on the side of an element placement surface 40a of a substrate 40 and integrated with this substrate 40, while the MR elements 10B, 20B and 30B may be disposed on the side of an element placement surface 40a of another substrate 40 and integrated with this substrate 40. In this case, if the three-dimensional magnetic field sensor 1 according to the first embodiment shown in FIG. 1 to FIG. 3 is considered as a single unit, the three-dimensional magnetic field sensor according to the second embodiment includes two units of the three-dimensional magnetic field sensor 1. The two units are disposed such that the element placement surfaces 40a of the two substrates 40 are parallel to each other.

The magnetization directions of the magnetization pinned layers 11 of the MR elements 10A and 10B are pinned in mutually opposite directions. The magnetization directions of the magnetization pinned layers 21 of the MR elements 20A and 20B are pinned in mutually opposite directions. The magnetization directions of the magnetization pinned layers 31 of the MR elements 30A and 30B are pinned in mutually opposite directions.

As shown in FIG. 13, the MR elements 10A and 10B are connected in series to form a half bridge circuit. Likewise, the MR elements 20A and 20B are connected in series to form a half bridge circuit, and the MR elements 30A and 30B are also connected in series to form a half bridge circuit. More specifically, one end of the MR element 10A is connected to a power source for supplying a sense current, and the other end of the MR element 10A is connected to one end of the MR element 10B. The other end of the MR element 10B is grounded. Similarly, one end of the MR element 20A is connected to a power source for supplying a sense current, and the other end of the MR element 20A is connected to one end of the MR element 20B. The other end of the MR element 20B is grounded. One end of the MR element 30A is connected to a power source for supplying a sense current, and the other end of the MR element 30A is connected to one end of the MR element 30B. The other end of the MR element 30B is grounded. In FIG. 13, filled arrows indicate the magnetization directions of the magnetization pinned layers, and hollow arrows indicate the magnetization directions of the free layers.

The magnitude of the voltage drop across the MR element 10A and the magnitude of the voltage drop across the MR element 10B vary according to the strength $H_X$ of the component of the external magnetic field H in the X direction. However, since the magnetization directions of the magnetization pinned layers 11 of the MR elements 10A and 10B are pinned in mutually opposite directions, the direction of the change in the magnitude of the voltage drop across the MR element 10A and the direction of the change in the magnitude of the voltage drop across the MR element 10B are opposite to each other. Therefore, the potential at the connecting point of the MR elements 10A and 10B varies according to the strength $H_X$ of the component of the external magnetic field H in the X direction. Similarly, the potential at the connecting point of the MR elements 20A and 20B varies according to the strength $H_Y$ of the component of the external magnetic field H in the Y direction, and the potential at the connecting point of the MR elements 30A and 30B varies according to the strength $H_Z$ of the component of the external magnetic field H in the Z direction.

Hereinafter, the potential at the connecting point of the MR elements 10A and 10B will be denoted as a signal $S_X$, the potential at the connecting point of the MR elements 20A and 20B will be denoted as a signal $S_Y$, and the potential at the connecting point of the MR elements 30A and 30B will be denoted as a signal $S_Z$. The signal $S_X$ corresponds to the output from the first magnetoresistive element according to the invention. The signal $S_Y$ corresponds to the output from the second magnetoresistive element according to the invention. The signal $S_Z$ corresponds to the output from the third magnetoresistive element according to the invention.

The three-dimensional magnetic field sensor according to the present embodiment further includes three gain control amplifiers (hereinafter abbreviated as GCAs) 51, 52, and 53, three analog-digital convertors (hereinafter abbreviated as A/D convertors) 61, 62, and 63, an arithmetic circuit 70, and a display unit 71.

The GCA 51 has an input connected to the connecting point of the MR elements 10A and 10B, and an output connected to the input of the A/D convertor 61. The GCA 52 has an input connected to the connecting point of the MR elements 20A and 20B, and an output connected to the input of the A/D convertor 62. The GCA 53 has an input connected to the connecting point of the MR elements 30A and 30B, and an output connected to the input of the A/D convertor 63. The arithmetic circuit 70 has three inputs that are connected to the outputs of the A/D convertors 61, 62, and 63, respectively. The arithmetic circuit 70 has an output connected to the input of the display unit 71.

The GCAs 51, 52, and 53 are amplifiers having controllable gains. The gains of the GCAs 51, 52, and 53 are set such that the levels of the signals $S_X$, $S_Y$, and $S_Z$ become equal to each other when the strengths $H_X$, $H_Y$, and $H_Z$ are the same. The gains of the GCAs 51, 52, and 53 are changed when processing for correcting the levels of the signals $S_X$, $S_Y$, and $S_Z$ is performed but are maintained constant in normal times. In the processing for correcting the levels of the signals $S_X$, $S_Y$, and $S_Z$, the relative positional relationship between the external magnetic field H and the three-dimensional magnetic field sensor, for example, is changed so vary the strengths $H_X$, $H_Y$, and $H_Z$ such that their maximum values are equal to each other and their minimum values are equal to each other, and the values of the signals $S_X$, $S_Y$, and $S_Z$ responsive to the strengths $H_X$, $H_Y$, and $H_Z$ are obtained. Then, the levels of the signals $S_X$, $S_Y$, and $S_Z$ are compared and the gains of the GCAs 51, 52, and 53 are controlled so that the levels of the signals $S_X$, $S_Y$, and $S_Z$ become equal to each other when the strengths $H_X$, $H_Y$, and $H_Z$ are the same, as described above.

The A/D convertors 61, 62, and 63 convert analog signals output from the GCAs 51, 52, and 53 to digital signals and transmit the digital signals to the arithmetic circuit 70. Based on the output signals from the A/D convertors 61, 62, and 63, the arithmetic circuit 70 generates data indicative of the three-dimensional direction of the external magnetic field H (hereinafter referred to as the three-dimensional direction data). The arithmetic circuit 70 can be implemented by a microcomputer, for example. The display unit 71 displays the three-dimensional direction data generated by the arithmetic circuit 70.

The three-dimensional direction data may be, for example, the detected values of the strengths $H_X$, $H_Y$, and $H_Z$ or values having a specific relation therewith. The three-dimensional direction data may also be angle data indicative of the direction of the external magnetic field H, for example. The angle data may be, for example, the angle $\theta_X$ that a vector formed by projecting a vector representing the external magnetic field H onto the XY plane $P_{XY}$ in FIG. 1 forms relative to the X direction, and the angle $\theta_Z$ that the vector representing the external magnetic field H forms relative to the XY plane $P_{XY}$. Letting the detected values of the strengths $H_X$, $H_Y$, and $H_Z$ be represented also by the symbols $H_X$, $H_Y$, and $H_Z$, respectively, the angle $\theta_X$ can be computed from $\text{atan}(H_Y/H_X)$, where "atan" represents arctangent. The angle $\theta_Z$ can be computed from $\text{atan}\{H_Z/\sqrt{(H_X^2+H_Y^2)}\}$. Based on the angles $\theta_X$ and $\theta_Z$ determined above, the arithmetic circuit 70 may generate image data for displaying the vector representing the external magnetic field H as an image, and based on the image data thus generated, the display unit 71 may display the vector representing the external magnetic field H as an image.

In the present embodiment, the GCAs 51, 52, and 53 may be omitted, and instead the microcomputer forming the arithmetic circuit 70 may be used to correct the levels of the signals $S_X$, $S_Y$, and $S_Z$. However, the provision of the GCAs 51, 52, and 53 allows effective use of the dynamic ranges of the A/D convertors 61, 62, and 63, and makes it possible to improve the accuracy of detection of the strengths $H_X$, $H_Y$, and $H_Z$.

The remainder of configuration, function and effects of the present embodiment are similar to those of the first embodiment.

The present invention is not limited to the foregoing embodiments, and various modifications may be made thereto. For example, in the second embodiment, only a single set of MR elements 10, 20, and 30 may be used and the GCAs 51, 52, and 53 may receive the respective potential differences across the MR elements 10, 20, and 30 as outputs from the MR elements 10, and 30.

It is apparent that the present invention can be carried out in various forms and modifications in the light of the foregoing descriptions. Accordingly, within the scope of the following claims and equivalents thereof, the present invention can be carried out in forms other than the foregoing most preferable embodiments.

What is claimed is:

1. A three-dimensional magnetic field sensor for detecting a three-dimensional direction of an external magnetic field, comprising:

a substrate having an element placement surface that is planar; and first, second and third magnetoresistive elements disposed on a side of the element placement surface of the substrate and integrated with the substrate, wherein:

each of the first, second and third magnetoresistive elements includes a magnetization pinned layer, a nonmagnetic layer, and a free layer that are stacked in a direction perpendicular to the element placement surface;

in each of the first, second and third magnetoresistive elements, the nonmagnetic layer is disposed between the magnetization pinned layer and the free layer, and the free layer has a magnetization direction that varies according to the direction of the external magnetic field;

the magnetization pinned layer of the first magnetoresistive element has a magnetization direction that is pinned in a first direction parallel to the element placement surface;

the magnetization pinned layer of the second magnetoresistive element has a magnetization direction that is pinned in a second direction parallel to the element placement surface and different from the first direction;

the magnetization pinned layer of the third magnetoresistive element has a magnetization direction that is pinned in a third direction perpendicular to the element placement surface;

the first magnetoresistive element detects a strength of a component of the external magnetic field in the first direction;

the second magnetoresistive element detects a strength of a component of the external magnetic field in the second direction; and the third magnetoresistive element detects a strength of a component of the external magnetic field in the third direction.

2. The three-dimensional magnetic field sensor according to claim 1, wherein the second direction is orthogonal to the first direction.

3. The three-dimensional magnetic field sensor according to claim 1, further comprising an arithmetic circuit that generates, based on outputs from the first, second and third magnetoresistive elements, data indicative of the three-dimensional direction of the external magnetic field.

4. The three-dimensional magnetic field sensor according to claim 1, wherein materials of the magnetization pinned layer, the nonmagnetic layer and the free layer of the second magnetoresistive element are the same as those of the magnetization pinned layer, the nonmagnetic layer and the free layer of the first magnetoresistive element, respectively.

5. The three-dimensional magnetic field sensor according to claim 1, wherein the magnetization pinned layer of the third magnetoresistive element contains at least one of an ordered alloy, an artificial lattice composed of a multilayer film, and an amorphous alloy.

6. The three-dimensional magnetic field sensor according to claim 1, wherein the free layer of the third magnetoresistive element has a coercivity in the third direction lower than that of the magnetization pinned layer of the third magnetoresistive element.

7. A method of producing the three-dimensional magnetic field sensor of claim 1, comprising the steps of forming the first magnetoresistive element; forming the second magnetoresistive element; and forming the third magnetoresistive element, wherein: the step of forming the first magnetoresistive element includes the steps of: forming a first stack, the first stack including a first film, the nonmagnetic layer of the first magnetoresistive element and the free layer of the first magnetoresistive element; and pinning the magnetization direction of the first film so that the first film becomes the magnetization pinned layer of the first magnetoresistive element; the step of forming the second magnetoresistive element includes the steps of forming a second stack, the second stack including a second film, the nonmagnetic layer of the second magnetoresistive element and the free layer of the second magnetoresistive element; and pinning the magnetization direction of the second film so that the second film becomes the magnetization pinned layer of the second magnetoresistive element; the step of forming the first stack and the step of forming the second stack are performed simultaneously; and the step of pinning the magnetization direction of the first film and the step of pinning the magnetization direction of the second film are performed separately.

* * * * *